United States Patent [19]

Sims et al.

[11] Patent Number: 5,012,041
[45] Date of Patent: Apr. 30, 1991

[54] SCREENED WINDOW FOR SHIELDED ENCLOSURE

[75] Inventors: Richard E. Sims, Arlington Hgts.; Joseph C. Weibler, West Chicago, both of Ill.

[73] Assignee: The Curran Company, Glendale Heights, Ill.

[21] Appl. No.: 369,717

[22] Filed: Jun. 22, 1989

[51] Int. Cl.⁵ .............................................. H05K 9/00
[52] U.S. Cl. .............................................. 174/35 MS
[58] Field of Search ................................... 174/35 MS

[56] References Cited

U.S. PATENT DOCUMENTS 2,958,754 11/1960 Hahn .............................. 174/35 MS
4,755,630 7/1988 Smith et al. .................... 174/35 MS

FOREIGN PATENT DOCUMENTS 2064629 6/1981 United Kingdom .

Primary Examiner—Leo P. Picard
Assistant Examiner—David A. Tone
Attorney, Agent, or Firm—Mason, Kolehmainen, Rathburn & Wyss

[57] ABSTRACT

A window for electromagnetic interference shielded enclosures has a shielding screen system with two grids having dimensionally different mesh patterns to overcome optical interference and distraction resulting from the moiré effect. The screens are supported in spaced, angularly offset positions on a continuous frame providing electrical continuity between the shielding system and the shielding layer of a surrounding wall.

20 Claims, 2 Drawing Sheets

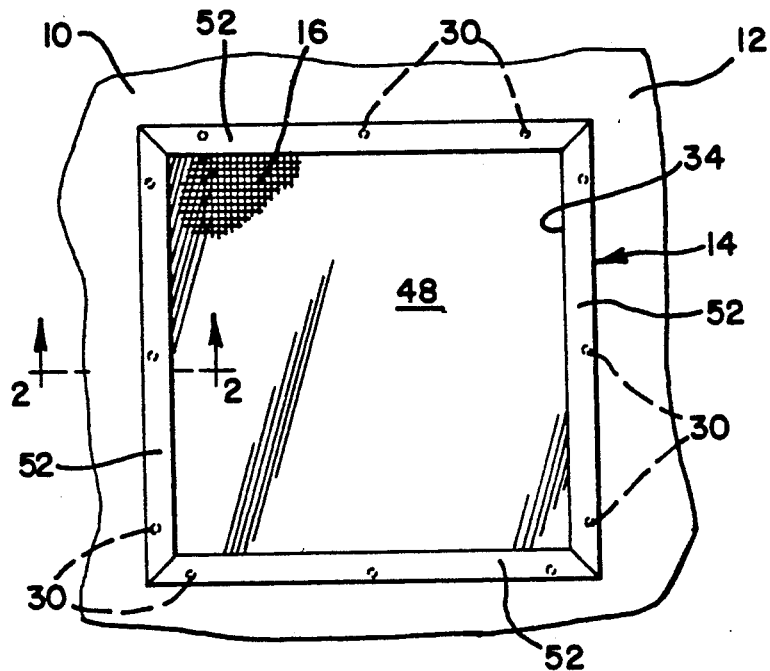
FIG-1-
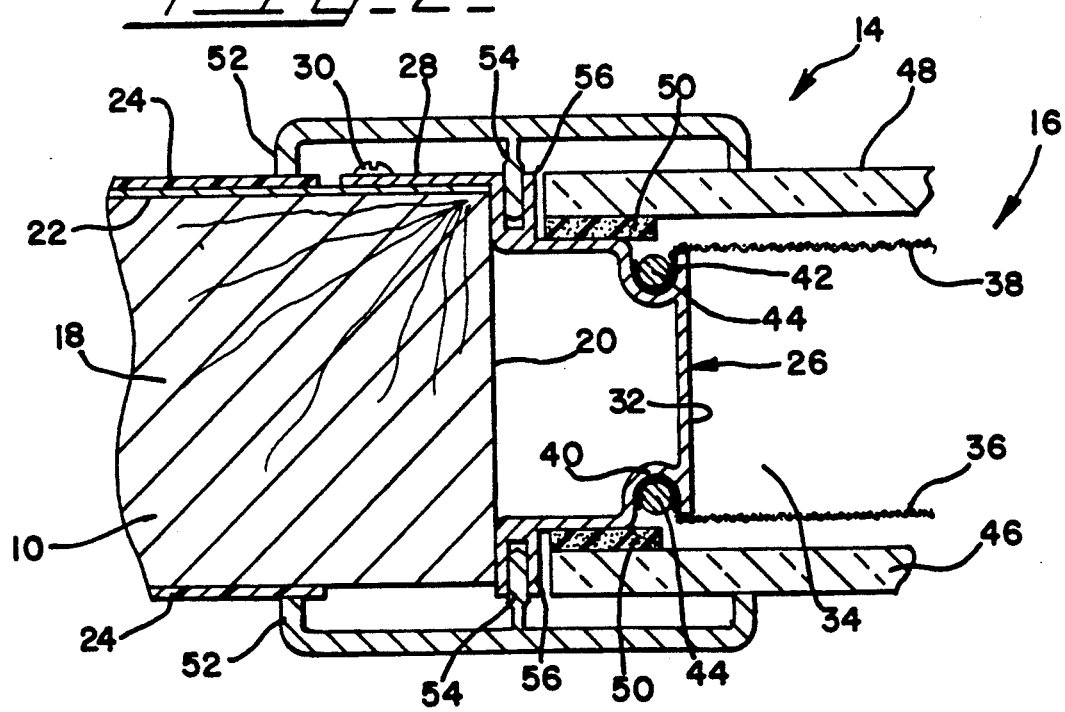
FIG-2-

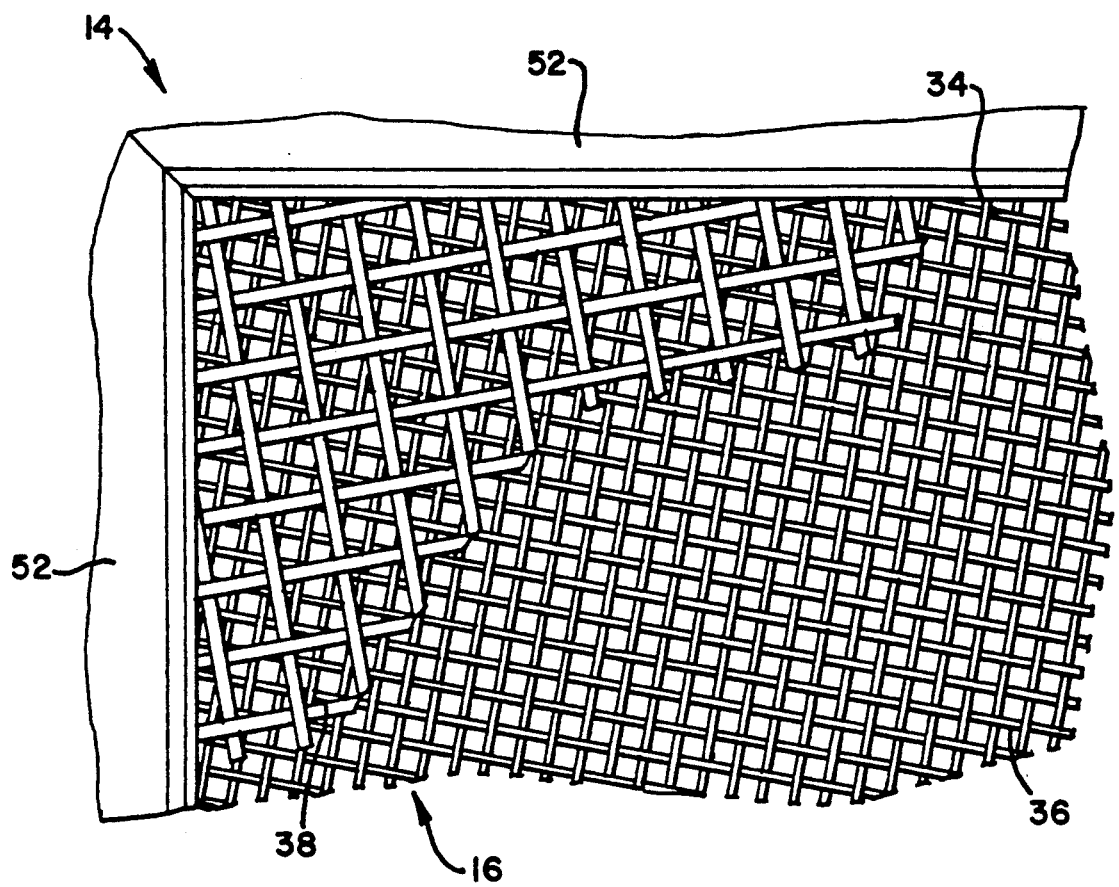
FIG_3_
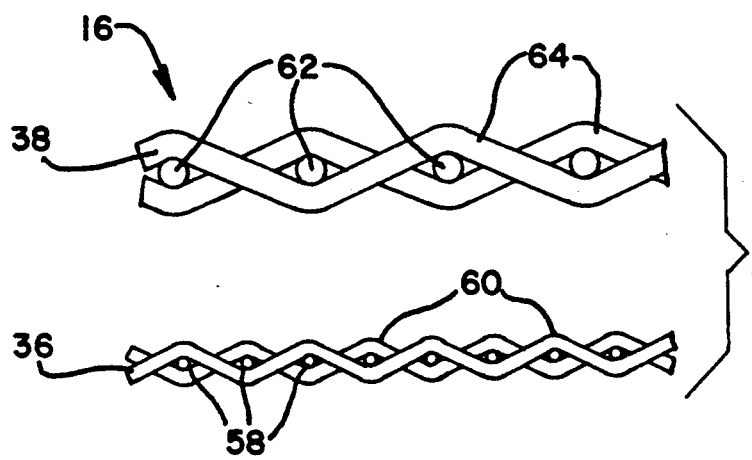
FIG_4_

SCREENED WINDOW FOR SHIELDED ENCLOSURE

FIELD OF THE INVENTION

The present invention relates to electromagnetic interference (EMI) shielding and more particularly to improved screen shielded windows for radio frequency (RF) and EMI shielded enclosures.

DESCRIPTION OF THE PRIOR ART

Shielded enclosures such as rooms are used to attenuate interference for a wide variety of applications such as nuclear magnetic resonance (NMR), laser alchemestry, hyperthermia, sensitive electronic testing and others. Known shielded enclosures include a single or double layer of electrically conductive shielding material such as copper or steel sheet, foil or grid entirely enclosing a shielded space. For example, the walls, floor and ceiling of a room may be surrounded by electrically continuous layers of a conductive shield, and the shield may be grounded at a single point to bypass to ground the electromagnetic energy to which the shield is subjected. It is important to maintain the integrity of the shielding where apertures such as doors and windows are required.

Windows are desired in some shielded enclosures. For example, in enclosures used with NMR equipment, the extremely sensitive equipment is located within the enclosure where it is shielded from ambient electromagnetic interference. The controls for the equipment include EMI emitting devices such as computers and peripheral devices and must be located outside of the enclosure. A window in the wall of the enclosure permits the operator to view the shielded equipment and a patient undergoing NMR procedures.

Conflicting objectives are present in the design of windows for shielded enclosures. In order to maintain the effectiveness of the shielding in the region of the window, the window should have high shielding capabilities. Yet, the window should be highly optically transmissive so that the view through the window is as clear and interference free as possible.

One type of shielded window that has been used in the past incorporates a single layer of conductive grid, typically a woven wire cloth. The grid covers the window opening and is attached and electrically connected to the shielding layer of a shielded enclosure. With a single grid layer, optical interference results from blocking of a certain portion of the window sight opening by the wire and from distracting effects if the wire is too large or if the wire grid is too fine. The wire size and mesh count of the wire cloth can be selected to maximize electrical conductivity and minimize optical interference.

Single layer metal grids are used where shielding requirements are not demanding. However for many purposes a single grid layer cannot provide enough shielding. To increase shield effectiveness of a window, double layers of similar metal grids such as wire cloth have been used. Double, spaced apart grid layers provide the necessary shielding performance, but are subject to serious problems of optical interference. There is an added cause of optical interference when two grids are superimposed. Due to a phenomenon called the moiré effect, disturbing interference patterns are seen when an observer looks through a window with two conductive grids. Attempts have been made to reduce this problem by rotating or skewing the two grids to provide an angular offset. An angle of about twelve degrees is typical. However, variations in the offset angle and in the wire size or mesh count do not appreciably reduce the moiré interference.

A different approach to solving this problem is described in U.S. Pat. No. 4,696,547. No grids are employed. Instead, an electrically conductive liquid fills the space between a pair of transparent window panels. While this approach is capable of providing both high shielding effectiveness and low optical interference, the complexity and expense of that window system can be a disadvantage in some cases.

SUMMARY OF THE INVENTION

A principal object of the present invention is to provide a window for shielded enclosures that achieves high shielding performance with a simple and low cost shielding grid system while avoiding the optical interference caused by the moiré, effect.

In brief, the objects and advantages of the present invention are achieved by providing an EMI shielded enclosure having walls enclosing an electromagnetic radiation shielded space. The walls include a substantially continuous metal shield, a window opening in a wall and a window mounted in the opening for blocking electromagnetic radiation while transmitting visible light. The window includes a first shielding screen electrically connected to the continuous metal shield and lying in a first plane spanning the window and a second shielding screen electrically connected to the continuous metal shield and lying in a second plane spanning the window. The first and second planes are spaced apart from one another. Both of the screens are formed of electrically conductive shielding material arrayed in mesh patterns. In accordance with the present invention, the mesh pattern of the first screen differs dimensionally from the mesh pattern of the second screen.

BRIEF DESCRIPTION OF THE DRAWINGS

The present invention together with the above and other objects and advantages may best be understood from the following detailed description of the embodiment of the invention illustrated in the drawings, wherein:

FIG. 1 is a fragmentary, elevational view of part of a shielded enclosure provided with a window incorporating the features of the present invention;

FIG. 2 is an enlarged, fragmentary, sectional view taken along the line 2—2 of FIG. 1;

FIG. 3 is a greatly enlarged, fragmentary, elevational view of a portion of the window of FIG. 1; and FIG. 4 is a greatly enlarged, fragmentary, sectional view of the shielding screens of the window of the present invention.

DETAILED DESCRIPTION OF THE PREFERRED EMBODIMENT

Referring now to the drawings, FIG. 1 shows a part of a wall 10 of a shielded enclosure 12 such as a room. Mounted in the wall 10 is a shielded window designated as a whole as 14 constructed in accordance with the principles of the present invention. The window 14 is provided with an improved shielding screen system generally designated as 16 for achieving high EMI shielding performance without an undesirable degree of optical interference.

The room 12 including the wall 10 may be of any preferred type of construction. As seen in FIG. 2, the wall 10 includes a frame element 18 serving along with other similar frame members to form a window opening 20 in the wall 10. A shielding layer 22 of metal on an outer surface of the wall 12 is continuous around the entire room 12 and its edges extend near the window opening 20. In the illustrated embodiment, frame member 18 is wood and the shielding layer 22 is copper sheet. If desired, both the inner and outer wall surfaces may be provided with shielding layers 22. A decorative finished appearance is provided on both the inner and outer wall surfaces by layers or sheets 24 of a surface material such as a plastic laminate.

Window 14 includes a structural frame 26 of similar cross sectional shape throughout (FIG. 2) extending completely around the window opening 20. Preferably the frame 26 is an extruded shape of a metal such as aluminum with mitered corners abutting at the corners of the window opening 20. The frame metal will usually be coated with a conductive metal such as tin. At the outer side of the frame a continuous mounting flange 28 extends over the outer wall and overlies the edge region of the shielding layer 22. Fasteners 30 extend through the flange 28 and shielding layer 22 into the frame element 18 to mount the frame securely in place in the window opening 20 and to assure a continuous, low resistance electrical connection between the frame 26 and the shielding layer 22. An inner wall 32 in a plane extending between the outer and inner surfaces of the frame 26 defines a window sight opening 34.

The window shielding screen system 16 includes first and second shielding screens 36 and 38 covering and shielding the entire window sight opening 34. As described below in more detail, each shielding screen is a grid of electrically conductive material selected and oriented in accordance with the present invention. Frame 26 includes inner and outer, spaced apart, oppositely directed screen mounting channels 40 and 42 located near the inner and outer surfaces of the frame 26. The edges of the shielding screens 36 and 38 are received in channels 40 and 42 continuously throughout the periphery of the window 14. Flexible beads or splines 44 tightly wedge or clamp the screens 36 and 38 in the channels 40 and 42 and assure intimate, high conductivity electrical contact between both of the shielding screens and the frame. The shielding screens 36 and 38 are sprayed with a very thin layer of black die to reduce glare and improve vision through the window assembly.

Two panes 46 and 48 of glass or other transparent window glazing material are attached to the frame 26 by double sided adhesive foam attachment strips 50. The shielding screens 36 and 38 are between the panes 46 and 48 and are protected from accidental contact and damage. In addition, the panes 46 and 48 block the travel of sound and the movement of air through the window 14. If this type of protection or isolation is not required, one or both of the panes 46 and 48 may be omitted. The shielding screen system 16 may be used without window panes to provide the desired EMI shielding.

Decorative trim pieces 52 cover the edges of the window 14 at the inner and outer wall surfaces to hide the transition between the wall 12 and the window, including flange 28 and fasteners 30, and to provide a neat and finished appearance. Central leg portions 54 of the trim pieces 52 are frictionally received in retention grooves 56 of the frame 26 to hold the pieces 52 in place.

Electrical continuity between the wall 12 and window shielding system 16 is provided by the frame 26. Flange 28 is in continuous intimate contact with the shielding layer 22, while the shielding screens 36 and 38 are in continuous intimate contact with the screen mounting channels 42. The result is an electrically continuous shield over and around the window area. The use of two shielding screens maintains the effectiveness of the shield across the window sight opening 34. By employing the principles of the present invention in the design of the system 16, a higher degree of visibility through the window 14 is possible.

The shielding screen system 16 of the present invention can best be seen in FIGS. 3 and 4. Each shielding screen 36 and 38 is a grid of electrically conductive material having a mesh pattern. In accordance with the present invention, the mesh patterns of the two screens 36 and 38 are dimensionally different which results in the greatly reduced optical interference over that encountered with dual screen systems having duplicate mesh patterns. In order to achieve the desired dimensional difference, the shielding screen 36 is a comparatively finer grid while the shielding screen 38 is a relatively coarser grid.

Shielding screen grids with mesh patterns may be formed of many different types of structures. Woven wire cloth is preferred due to its availability and relative cost. However other structures such as lattices, expanded grates, perforated sheets, grids vacuum deposited on glass sheets and others might also be used.

In a grid such as employed in the shielding screens 36 and 38, the intersecting elements of conductive material subdivide the area of the grid into an array of open areas, each of which is termed a mesh. The relative fineness or coarseness of the grid is described in terms of mesh count. Mesh count is the number of openings along a given linear direction. For example, a conventional window insect screen material has a mesh count of eighteen per inch in both orthagonal directions.

In accordance with the present invention, the mesh counts of the screens 36 and 38 differ from one another. When the difference exceeds about twenty percent, the interference and distraction caused by the moiré effect is substantially reduced or eliminated. In order to maintain the shielding effectiveness of the coarser grid screen and to avoid blocking too much of the total viewing area with the finer grid screen, the mesh count difference ratio should not be more than about two to one. A finer grid screen having a mesh count about eighty percent larger than the mesh count of the coarser grid screen generally optimizes the advantages of the invention.

Because an important goal of the present invention is to reduce optical interference and distraction, the coarser grid of the screen 38 should be fine enough to avoid distracting an observer. For best results, the mesh pattern of the shielding screen 38 should preferably have a mesh count larger than the sixteen per inch mesh count of conventional window screen material. While a coarser mesh could accomplish many of the results of the invention, the use of a somewhat finer mesh prevents an observer from seeing the grid of wires when looking through the screen 38 with normal eye focus. The best results are obtained if the grid count is higher than about twenty per inch with cloth woven from wire having a diameter in the approximate range of 0.0040–0.0080 inch.

The advantages arising from a mesh pattern difference between screens 36 and 38 suggests that the mesh count of screen 36 should be relatively high. However, to avoid optical interference, it is preferred that the grid of screen 36 not be too fine. If the grid is too fine, a blurred or fuzzy or "ghost" image can result. The best results are obtained if the grid count of the fine grid screen 36 is less than about fifty per inch with cloth woven from wire having a diameter in the approximate range of 0.0040–0.0060 inch.

The undesired effects of moiré pattern interference are further reduced by an angular offset between the grids of the screens 36 and 38. As seen in FIG. 3, the wires of screen 36 are arrayed at an angle to the wires of screen 38. In typical dual screen systems used in the past, angular offsets of twelve degrees have been used with two similar screens. With dimensionally different shielding screens in accordance with the present invention, a larger angle in the range of fifteen to twenty-five degrees produces better results.

The optical quality of the shielding system is decreased if the shielding screens 36 and 38 are not spaced apart. It is preferable if the two screens are located at different distances from the eyes of an observer. Preferably, the screens are separated by more than about one-half inch. Depending upon the thickness of wall 12, the screens may be separated by as much as about two inches.

In the preferred embodiment of the invention, screen 36 is a plain square weave cloth of similar warp wires 58 and shute or weft wires 60 both having a diameter of 0.0050 inch in a pattern having a mesh count of forty-three per inch in both axes. Screen 38 is a plain square weave cloth of similar warp wires 62 and shute or weft wires 64 both having a diameter of 0.0075 inch in a pattern having a mesh count of twenty-four per inch in both axes. An observer can see through the screens 36 and 38 because the screens are respectively about sixty-two and sixty-seven percent open or unobstructed by wire in the direction perpendicular to the planes of the screens. The preferred wire material for screens 36 and 38 is an austenitic stainless steel having low electrical resistivity. Both screens are regular orthogonal grids. Wires 58 and 62, as well as wires 60 and 64, are positioned at an offset angle of twenty degrees. The screens 36 and 38 are parallel and spaced one and one-half inches apart. Both screens are spray coated with black die or otherwise blackened to reduce the glare from the stainless wire. The advantages of the present invention can be realized without employing this specific arrangement.

While the invention has been described with reference to details of the illustrated embodiment, these details are not intended to limit the scope of the invention as defined in the appended claims.

We claim:

1. An EMI shielded enclosure comprising wall means enclosing an electromagnetic radiation shielded space, said wall means including a substantially continuous metal shield, a window opening in said wall means, and a window in said opening for blocking electromagnetic radiation while transmitting visible light;
   said window including a first shielding screen electrically connected to said continuous metal shield and lying in a first plane spanning said window;
   a second shielding screen electrically connected to said continuous metal shield and lying in a second plane spanning said window;
   said first and second planes being spaced apart from one another;
   both of said screens being formed of electrically conductive shielding material arrayed in mesh patterns, each of said mesh patterns being a grid;
   and the improvement in accordance with which the mesh count of the first screen is at least about twenty percent larger than the mesh count of the second screen.

2. An EMI shielded enclosure as claimed in claim 1 wherein the material of each of said screens is in an orthagonal array.

3. An EMI shielded enclosure as claimed in claim 1 wherein said grids are angularly offset from one another.

4. An EMI shielded enclosure as claimed in claim 1 wherein the conductive material of each of said screens is blackened to reduce glare.

5. An EMI shielded enclosure as claimed in claim 1 wherein the conductive material of each of said screens is woven wire cloth.

6. An EMI shielded enclosure as claimed in claim 1 wherein the mesh count of said first screen is larger than the mesh count of said second screen by a percentage in the approximate range of from twenty to one hundred percent.

7. An EMI shielded enclosure as claimed in claim 1 wherein the mesh count of said first screen is about eighty percent larger than the mesh count of said second screen.

8. An EMI shielded enclosure as claimed in claim 7 wherein the mesh count of said first screen is about forty-three per inch and the mesh count of said second screen is about twenty-four per inch.

9. A window for the window opening of an electromagnetic interference shielded enclosure comprising:
   an electrically conductive frame defining the periphery of the window and defining a frame sight opening;
   said frame including inner and outer screen mounting structures located adjacent the opposite sides of the frame;
   said frame including mounting means for mounting the frame in the window opening;
   a first wire cloth screen mounted in one of said screen mounting structures and covering said window sight opening;
   a second wire cloth screen mounted in the other of said screen mounting structures and covering said window sight opening; and
   said first screen having a mesh count between about twenty and one hundred percent larger than the mesh count of said second screen.

10. A window as claimed in claim 9 wherein the wires of said first screen are angularly offset by about fifteen to twenty-five degrees from the wires of said second screen.

11. A window as claimed in claim 9 wherein said first screen is spaced about one-half to two inches from said second screen.

12. A window as claimed in claim 9 wherein a transparent pane is mounted on said frame over said window sight opening.

13. A window as claimed in claim 9 wherein a pair of transparent panes are mounted on said opposite sides of said frame, said first and second screens being between said panes.

14. A window as claimed in claim 9, wherein said screens have mesh counts of about twenty-four per inch and forty-three per inch and the wires of said first screen are angularly offset about twenty degrees from the wires of said second screen.

15. In an optically transmissive electromagnetic interference shielding system of the type including first and second, spaced apart shielding screens having mesh patterns, an improvement for reducing moiré optical interference patterns in accordance with which the mesh counts of said first and second screens differ by at least about twenty percent.

16. The shielding system of claim 15, the mesh counts of the screens differing by less than about one hundred percent.

17. The shielding system of claim 15 wherein the mesh counts of said first and second screens differ by about eighty percent.

18. The shielding system of claim 15, one screen comprising a wire cloth woven of wire with a diameter of about 0.0040–0.0060 inch with a mesh count of about 40–50 per inch and the other screen comprising a wire cloth woven of wire with a diameter of about 0.0060–0.0080 inch with a mesh count of about 20–30 per inch.

19. The shielding system of claim 18 wherein said screens are angularly offset by about fifteen to twenty-five degrees.

20. The shielding system of claim 15 wherein said shielding screens are blackened.

* * * * *